United States Patent [19] [11] 3,911,333
Notarys et al. [45] *Oct. 7, 1975

[54] MULTILAYERED THIN FILM SUPERCONDUCTIVE DEVICE, AND METHOD OF MAKING SAME

[75] Inventors: Harris A. Notarys, Pasadena; James E. Mercereau, South Laguna, both of Calif.

[73] Assignee: California Institute of Technology, Pasadena, Calif.

[ * ] Notice: The portion of the term of this patent subsequent to Mar. 19, 1991, has been disclaimed.

[22] Filed: Nov. 5, 1973

[21] Appl. No.: 412,761

Related U.S. Application Data

[63] Continuation of Ser. No. 338,907, March 7, 1973, Pat. No. 3,798,511.

[52] U.S. Cl. .......................... 357/5; 307/306; 357/4
[51] Int. Cl. .......................................... H03k 3/38
[58] Field of Search...... 317/234 S, 234 T; 307/306; 331/107 S

[56] References Cited

UNITED STATES PATENTS

| | | | |
|---|---|---|---|
| 3,370,210 | 2/1968 | Fiske | 317/235 |
| 3,564,351 | 2/1971 | McCumber | 317/234 |
| 3,643,237 | 2/1972 | Anacher | 340/173.1 |
| 3,697,826 | 10/1972 | Mitani | 317/234 R |
| 3,702,956 | 11/1972 | Renard | 317/234 R |
| 3,733,526 | 4/1973 | Anacher | 317/234 R |
| 3,751,721 | 8/1973 | Fulton | 317/234 |

*Primary Examiner*—Martin H. Edlow
*Attorney, Agent, or Firm*—Lindenberg, Freilich, Wasserman, Rosen & Fernandez

[57] ABSTRACT

Techniques are disclosed for fabrication of superconducting thin film structures which show Josephson-like effects and which allow fabrication of standard components, such as resistors and capacitors in circuits, starting with the deposition of superimposed thin films of selected metals at least one of which is superconducting, and all of which are stable (i.e., will not diffuse and are sufficiently inert to be chemically stable under normal use). The thin films are all effectively removed around the desired structure by anodization through a photoresist mask or by ion beam etching. A structure which shows a Josephson-like effect is produced by so manipulating the thin films that a thin line region across a narrowed section of the layered thin films is produced with a lower transition temperature than in the surrounding layered films. This is done by altering the ratio of the thickness of the superconductive thin film to the thickness of the non-superconductive thin film in the thin line region and controlling the dimension, *l*, of the thin line region in the direction of current flow.

21 Claims, 16 Drawing Figures

MULTILAYERED THIN FILM SUPERCONDUCTIVE DEVICE, AND METHOD OF MAKING SAME

This is a continuation of application Ser. No. 338,907, filed Mar. 7, 1973, now Pat. No. 3,798,511.

BACKGROUND OF THE INVENTION

This invention relates to superconductive devices and methods of making same, and more particularly to thin film superconductive devices which exhibit quantum phenomena.

Electronic applications of superconductivity generally involve the behavior of a superconductor at a finite voltage. These applications fall into two general classes: one involves circuits utilizing the very low resistance of a superconductor, and the other involves more explicit macroscopic quantum phenomena.

The heart of all of the superconducting quantum device is B. D. Josephson's original prediction in "Possible New Effects in Superconductive Tunneling," Phys. Letters, vol. 1, pp. 251–253, 1962, relating supercurrent through barriers to quantum phase. For the superconducting tunnel junction this relationship can be written in terms of supercurrent density $j_s$ and voltage V as:

$$j_s = j_o \sin \frac{2e}{\hbar}\left(\int V dt + \alpha\right)$$

where $\hbar$ is equal to $h/2\pi$ and $\alpha$ is a phase angle determined by magnetic flux. The quantum flux $\hbar/2e$ is often denoted by $\phi_o$.

This unusual relationship arises from the macroscopic quantum nature of superconductivity and predicts that a constant voltage applied to a Josephson tunnel junction produces an oscillating supercurrent of amplitude $j_o$ at frequency $$\omega = \frac{2eV}{\hbar}.$$

However in the usual electronic application these junctions are not driven at constant voltage but are included in more general circuits. It has been found that a useful equivalent circuit for the superconducting tunnel junction element can be obtained by augmenting the Josephson current by parallel resistive and capacitive current paths. Many models of this type have been devised which seem to describe the behavior of Josephson tunnel junctions at finite voltage with reasonable success.

A second type of superconducting function involves more complex contortions of the superconducting state. In the tunnel junction, the basic timed dependence involves only the relative quantum phase $\Delta\phi$ across the junction. It is the evolution of this phase difference, $\Delta\phi = \phi_o^{-1}(\int V dt + \alpha)$, which controls the supercurrent. There is another class of Josephson device, the genesis of which is the Dayem bridge, in which both the amplitude and phase of the macroscopic quantum state are time dependent. See P. W. Anderson and A. H. Dayem, "Radio Frequency Effects in Superconducting Thin Film Bridges," Phys. Rev. Letters, vol. 13, pp. 195–197, 1964. This time dependent quantum process is called "phase slip": the amplitude of the quantum state goes instantaneously to zero within a small region of the superconductor and recovers while the relative phase across this region changes by $2\pi$. In this situation dissipation by the superconducting state itself becomes an important concept and the equivalent circuit for this process cannot fully be described by the addition of parallel components to a Josephson tunnel junction.

The following describes how voltage is developed by the process of phase slip dissipation. This is somewhat equivalent to describing quantum transitions of this macroscopic quantum state. Phase slip is a local process in the superconductor during which superconductivity is destroyed in a small region extending roughly one coherence distance, $\xi$. During phase slip, the amplitude of the macroscopic quantum states goes to zero and recovers. The time scale for this is of the order of $\tau \sim h/\Delta \sim 10^{-11} - 10^{-12}$ sec, and the relative quantum phase across the region of decay changes by $2\pi$. The energy loss per electron in this instantaneous destruction of superconductivity is the superconducting energy gap potential $\Delta$ and for the entire circuit amounts to $\bar{I}_s\phi_o$, where $\bar{I}_s$ is the average of the supercurrent existing before and after slip.

It has been shown that above the critical current in sufficiently small superconducting structures a repetitive phase slip process occurs at a repetition rate given by $$\omega = \frac{2e}{\hbar}V.$$

See T. J. Rieger, D. J. Scalapino and J. E. Mercereau, "Time Dependent Superconductivity and Quantum Dissipation," Phys. Rev. B, August 1972. In an attempt to characterize this dynamic superconducting process, structures ("junctions") have been developed in which the phase slip can be controlled and many aspects of this process have been measured. Phase slip in these junctions is believed to be a non-propagating process in which the superconducting amplitude and phase are time dependent but there is no motion involving the transport of quantized flux. Contrary to the tunnel junction these structures operate by a basically discontinuous, irreversible process which consumes power. Power consumed by this type of junction will be the normal $V^2/R$ plus a non-Ohmic superconducting dissipation equal to the loss per slip $(\bar{I}_s\phi_o)$ multiplied by the number of slips per second $V\phi_o^{-1}$ or $I_sV$.

Measurement and analysis of the potential developed by dissipation across these small phase slip structures reported in R. K. Kirschman, H. A. Notarys, and J. E. Mercereau, "AC and DC Potentials in Superconducting Phase-Slip Structures," Phys. Letters, vol. 34A, pp. 209–211, 1971, and J. E. Mercereau, "Superconducting Magnetometers," Rev. Phys. Appl., vol 5, pp. 13–20, 1970, shows that for currents I greater than the critical current $I_c$ the potential V resulting from discontinuous phase slip can be approximated by the following continuous function in most circumstances:

$$V = RI - \frac{1}{2}RI_c(B,T)\left\{1 + \cos \frac{2e}{\hbar}\int(V dt + \alpha\right\}, \quad (1)$$

where $R$ is the resistance of the junction in the normal state, $I_c$ is a function of both magnetic field $B$ and temperature $T$, and $\alpha$ accounts for any current at zero voltage. In small junctions at low voltage the magnetic field dependence of $I_c$ is similar to that of a Josephson tunnel junction. This function expressed by equation (1) is of course not entirely accurate in a physical sense especially near the gap frequency, since it approximates a discontinuous process. Nevertheless, it has proved to be a generally useful function with which to describe dissipation in superconducting circuits of the present invention. The dissipation voltage V, (or the energy loss per electron in traversing the junction) is less than in the normal state (IR) by a time dependent quantity which we call the Josephson potential. For a sufficiently short junction the magnitude of this potential ($\frac{1}{2}RI_c$) depends only on the energy gap of the superconductor $\Delta$ and as for the Josephson tunnel junction, is approximately $\Delta/e$. To emphasize the non-Ohmic nature of this dissipation, let $v_s=\frac{1}{2}RI_c$ and write an "Ohm's Law" for these weak superconductors as:

$$V = IR - v_s(T,B)\left\{1+\cos\frac{2e}{\hbar}\left(\int V dt+\alpha\right)\right\}. \quad (2)$$

This potential is both time and temperature dependent. At temperatures and currents where $v_s << IR$ the voltage V developed from a given current I is nearly constant with time average $\overline{V}=IR-v_s$ and with only a small time varying component $$V_s(t) = v_s \cos\frac{2e}{\hbar}\overline{V}t.$$

However, when $v_s \approx \frac{1}{2}RI$, the amplitude of $V$ is strongly time dependent even for constant $I$ leading to extreme anharmonic voltages — becoming pulselike with an amplitude $\approx RI$, width $\tau=\phi_o(RI)^{-1}$, and repetition rate $\nu=\overline{V}\phi_o^{-1}$.

Equations (1) and (2) appear to have general validity for these specially prepared phase slip junctions in most situations using measured values for R and $I_c$. These expressions have been experimentally tested by measurements on the amplitude, frequency, and frequency spectrum of the time dependent voltage developed from a current source. In addition current-voltage curves have been measured in a wide variety of circumstances with both current and voltage sources at various frequencies.

By inspection of equation (2) it is evident that the equivalent circuit for these phase slip circuits is a resistor (R) in series with a voltage source $$v_s\left\{1+\cos\frac{2e}{\hbar}\int(V dt+\alpha)\right\}.$$

In using this equivalent circuit it must be kept in mind that $v_s$ is not a source of power. The circuit only expresses the fact that the weak superconductor dissipates less than the normal state at a given current—the energy loss per electron, V, is less than IR. On the other hand it also indicates that a weak superconductor dissipates more than the normal state at a given voltage.

With this equivalent circuit for the phase-slip process, circuit analysis of more complex superconducting circuits containing this type of junction can be done. The general procedure is to use equation (2), and the equivalent circuit for phase slip, to account for dissipation in these superconducting circuits. In this way the dynamics of the circuit can be completely described as the response of the circuit to a power source. By directly specifying the dissipation in the circuit in terms of the quantum periodicity, as in equation (2), the dynamic properties of the circuit are a necessary result, even in a non-equilibrium dissipating state.

Thin film structures with controllable parameters have been developed in order to investigate this phase slip process in a junction. Basically, a small region of known dimensions in a superconducting thin film is made more weakly superconducting than the film proper. This region, which has an altered transition temperature, acts to confine the location of phase slip. In the past, phase-slip junctions have been achieved by depositing a narrow thin film line or normal material on a glass substrate using plastic scratching or photoresist etching techniques. This "line" is then overlayed with a soft superconductor to form a layered region. Soft superconductors are those metals which diffuse appreciably at room temperature. The soft superconductors used were Pb, Sn, In and their various alloys, and the normal metals used were Au, Cu or Permalloy (a nickle-iron alloy).

Most soft superconductors form alloys when superimposed (except for Cu/Pb) and hence the description of the phase-slip effect must be modified. In the alloy case the relative transition temperature is determined by the composition of the alloy and any phase-slip effect is limited to that in very narrow junctions where it is due to proximity from the adjoining films. These alloyed films give the same general effects since the local transition temperature of the alloy is also a function of the relative superconducting and normal film thicknesses. Hence, the phase-slip effect description can be used by merely using composition dependence of the transition temperature for the alloy rather than the expected proximity dependence.

For practical reasons the tin-gold (Sn/Au) thin film structure has been the most commonly used and its fabrication is typical of the soft superconductor structures. First a narrow line of Au is formed on a sapphire wafer in one of the following ways. For lines 0.3$\mu$ to 3$\mu$ wide the wafer is dipped in a dilute solution of collodion and a thin film of plastic allowed to form on it on removal. This thin film of collodion is then scratched by drawing the edge of a razor blade across it. Subsequent evaporation of Au over the scratched line and dissolution of the collodion leaves only a narrow strip of gold film in the scratched line. For lines $\geq$ 3$\mu$ wide the Au film is first evaporated on a sapphire wafer. Photoresist is then applied, exposed, and developed so that subsequent chemical etching leaves the desired width of gold strip. For lines $\geq$ 5$\mu$ there is direct Au evaporation through a mask. The second step in fabrication, after the Au line is formed, is to evaporate Sn over the entire plate. Sn develops an oxide layer very quickly so that it is important to evaporate Au first to minimize contamination due to an oxide forming between layers. The final step is to narrow the Sn film at the Au line to give the desired structure width. Note that the width of the Au line is now the junction length in the direction of current flow across the junction. Indium contacts pressed onto the film on opposite sides of the junction complete the thin film structure.

SUMMARY OF THE INVENTION

Improved structures exhibiting a quantum phenomena (phase-slip effect) are provided in layered thin film structures of superconductors and normal metals. A "normal" metal is one non-superconductive to a temperature below a predetermined transition temperature. A thin line region across a narrowed section of the layered thin films is made more weakly superconducting than the layered films by altering the ratio of the thickness of the superconducting thin film to the thickness of the normal metal and controlling the dimension, $l$, of the thin line region in the direction of current flow. In general, the greater the thickness of the normal metal relative to the superconductor in that thin line region, the lower the transition temperature of the layer of the layered thin films below the transition temperature of the surrounding layered thin film structure except that for sufficiently small dimension, $l$, the transition temperature may be higher than otherwise, even when the aforesaid "ratio" is reduced to zero. Metals which will bond to the surface on which deposited, will not diffuse appreciably at room temperature, and are sufficiently inert to be chemically stable under normal use, are preferred for the thin films. Shaping the structure, altering the ratio of thickness and controlling the dimension $l$, as required, may be by ion beam etching, in which case metals can be selected from a large group. That group consists primarily of Nb, Ta, W, Ti, Zr, Hf, Re, Rh, Ir, Pd, Pt and Al, and compounds or alloys of these elements, including any compounds or alloys of these elements with other elements, provided the compound or alloy retains the characteristic of not diffusing appreciably at room temperature. In addition, some ferromagnetic alloys, such as alloys or iron, cobalt and nickel, can be used as normal metals as they will not diffuse appreciably and are chemically stable under normal use. All of those enumerated elements have known transition temperatures, except HF and Pt, and alloys of iron, cobalt and nickel, but even Hf and Pt are expected to become superconductive at a sufficiently low temperature. At higher temperatures they can be used as normal metals in the layered thin film structure. Aluminum is the least desirable because it will not bond well, but alloys such as Nb-Al will bond well. Selective anodization using a photoresist mask may also be used to manipulate the shape and relative thicknesses of the thin films. If that technique is used, the selection of metals is limited to the group consisting of Nb, Ta, W, Ti, Zr, Hf and Al, and compounds or alloys thereof, including compounds or alloys of these elements with other elements as in the more general case.

DESCRIPTION OF THE PREFERRED EMBODIMENTS

When a normal (non-superconducting) metal film is superimposed directly on a superconducting metal film is superimposed directly on a superconducting metal film, with no intervening oxide layer, or vice versa, the transition temperature of the resultant superconducting sandwich is depressed below that of the superconductor. In the thin film limit the transition temperature of the sandwich depends on the relative thicknesses of the normal and superconducting films and decreases as the normal material thickness is increased for a fixed superconductor thickness. A similar situation exists for a sandwich of two superconductors of different transition temperature. Since the transition temperature is a measure of the relative "strength" of the superconductivity, the lower the transition temperature is made, the "weaker" the superconducting sandwich film becomes. Hence by locally varying the relative thickness of layered normal and superconducting films, it is possible to develop inhomogeneities in the relative superconductivity of various parts of the thin film layered structure.

Figure 1:
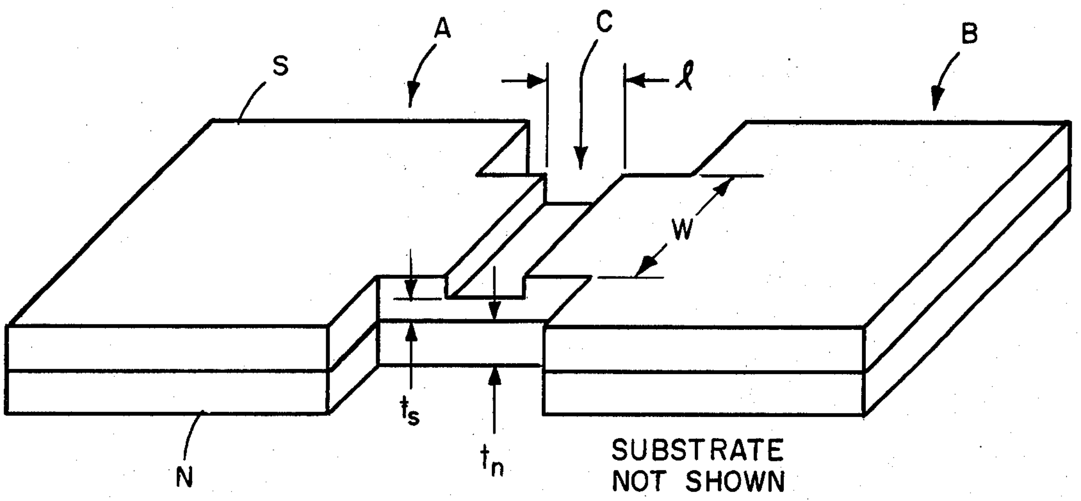
FIGS. 1 and 2 illustrate layered thin flim structures exhibiting quantum phenomena according to the present invention.

In this way a structure comprised of a thin film S of superconducting metal superimposed directly on a thin film N of non-superconducting metal in the form shown in FIG. 1 can be constructed where an inhomogeneous region C of length $l$, width $w$, and thickness $(t_n+t_s)$ has characteristic transition temperature $T_c$ lower than the transition temperature of the surrounding film structure. But the transition temperature of the inhomogeneous region C of length $l$ will be lower only if $l$ is sufficiently large. For sufficiently short $l$, the transition temperature $T_c$ of the inhomogeneous region will be higher. This results from the same proximity phenomenon which determines the transition temperature of the thin film layered structure in sections A and B but is caused by a different geometrical aspect of the film and may include interference between proximity effects from the two adjoining sections A and B. Due to this proximity effect across the inhomogeneous region C, its transition temperature $T_c$ can be very low but the actual transition temperature may be close to that of the adjoining structure sections A and B. It is thus possible to vary the coupling strength between the main superconducting sections A and B by varying the ratio $t_s$:$t_n$ and the length $l$ of the region R. For a given ratio $t_s$:$t_n$, there is a range of $l$ over which Josephson-like effects are generated. However, if $l$ is too short the coupling between the two superconducting film sections A and B becomes too strong and the film acts as a continuous homogeneous superconductor; conversely, if $l$ is too long the coupling is destroyed by fluctuations and the film acts as three separate but electrically connected superconductors. As the ratio $t_s$:$t_n$ decrease, the necessary $l$ for Josephson-like effects becomes shorter. The parameters $T_c$ and $l$ are detailed functions of the particular materials and films, and need to be determined empirically in order to maximize the Josephson-like effects for a particular material combination. It is this layered film structure with an inhomogeneous region, and methods of fabricating it that is the subject of the present invention.

These thin film structures have been fabricated from many different superconducting materials, and it has been found that the Josephson characteristics are in general independent of material. However, because of specific properties of the different materials the fabrication techniques to be used fall into two general classes — one for soft superconductors and the other for hard superconductors. For purposes of this invention, a hard superconductor is defined as a metal which will not diffuse appreciably in a layered thin film structure and is sufficiently inert to be chemically stable under normal use. For processing with anodization techniques, a hard superconductor is further limited to those metals which form hard (stable) oxides. For processing with ion beam etching techniques, a larger range of metals may be included in the class of hard superconductors. In either case, the metals selected must be able to bond well in a thin film structure, not only between the films but between a substrate and the first film, and in both cases the metals selected may be compounds and alloys of hard superconductors, and compounds and alloys of hard superconductors with other elements, e.g., nitrides and carbides.

Chemical etching techniques which have been used for soft superconductors (i.e., superconductors which are not "hard superconductors" as just defined) do not permit the high resolution local variable depth manipulation of the superconducting thin film structure which is necessary for an inhomogeneous region. The chemical etching resolution possible with photoresist techniques is only a few microns and the depth is not controlled. Consequently, inhomogeneities have been formed in the past by sequential evaporations of various shaped films on a substrate rather than post shaping of sequentially evaporated films in accordance with the present invention, i.e., in contrast to the use of hard superconductors which can be locally manipulated by anodization with high resolution to well controlled depths or ion beam etching. The dimensional resolution possible with anodization and photoresist techniques is less than $0.3\mu$, and thickness can be controlled to a few Angstroms. Similar resolution can be achieved with ion etching techniques.

The soft superconductors were investigated first because of the ease of film production, however, their fabrication cannot easily be applied to general microcircuitry. Hence, although the soft superconductor inhomogeneous structures are effective in showing Josephson-like effects, a general superconducting microcircuit technology is likely only with hard superconductors. The hard superconductor inhomogeneous structures and their fabrication techniques are compatible with microcircuit technology.

Figure 2:
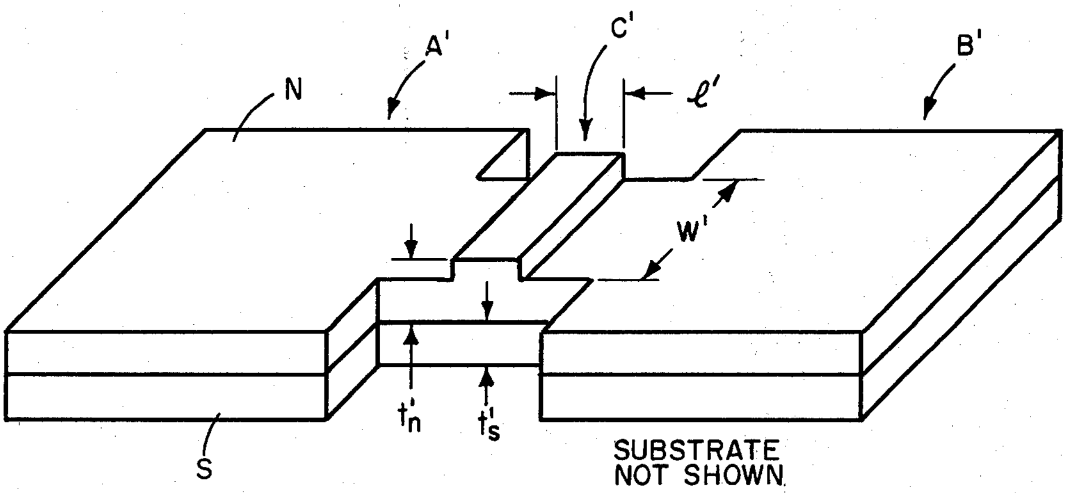

Before proceeding with specific examples of the present invention, it should be noted that the superconducting film S need not be superimposed on top of the normal film N. Instead, the superconducting film may be deposited first on a substrate. The normal film is then deposited on top and manipulated to provide an inhomogeneous region C′ between sections A′ and B′ as shown in FIG. 2. The normal film is deposited to an extra thickness and then reduced in thickness everywhere except the region C′ where the original thickness $t_n'$ of the deposited normal layer is retained. The ratio of the thickness $t_s'$ of the superconducting film to the thickness $t_n'$ of the normal film in the region C′ is selected for the desired transition temperature $T_c'$, just as in the case of the inverse arrangement of FIG. 1. The difference is that since the superconducting film cannot now be reduced in thickness, it is necessary to effectively increase the thickness of the normal film by starting with a thicker film and reducing it everywhere except in the region C′. In both cases, the thin film structure is necked down to the desired width of the region C as shown in FIGS. 1 and 2 for reasons to be explained hereinafter.

Figure 3:
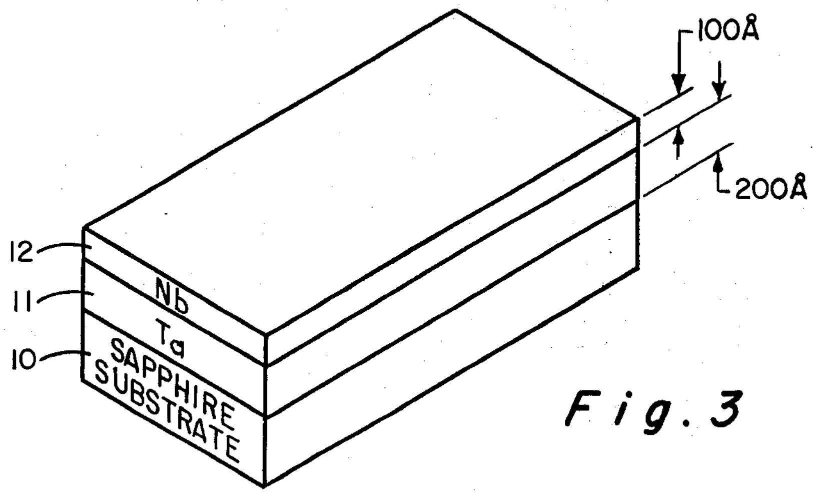
FIGS. 3 to 6 illustrate a preferred technique for producing layered thin film structures exhibiting quantum phenomena.

An anodizing technique of fabrication will now be described with reference to FIG. 3. A typical thin film structure is prepared for use as a superconductive quantum interference device on a sapphire substrate 10 by vapor depositing a thin film (200 A) of tantalum 11 directly on the sapphire 10, and vapor depositing a thin film (100 A) of niobium 12 directly on the Ta film without removing the structure from the vapor deposition chamber in order to avoid any possibility of oxidation between the superconductive metal films. Here the Ta film serves as an underlying normal metal and the Nb film as the superconductive metal.

Figures 4, 8:
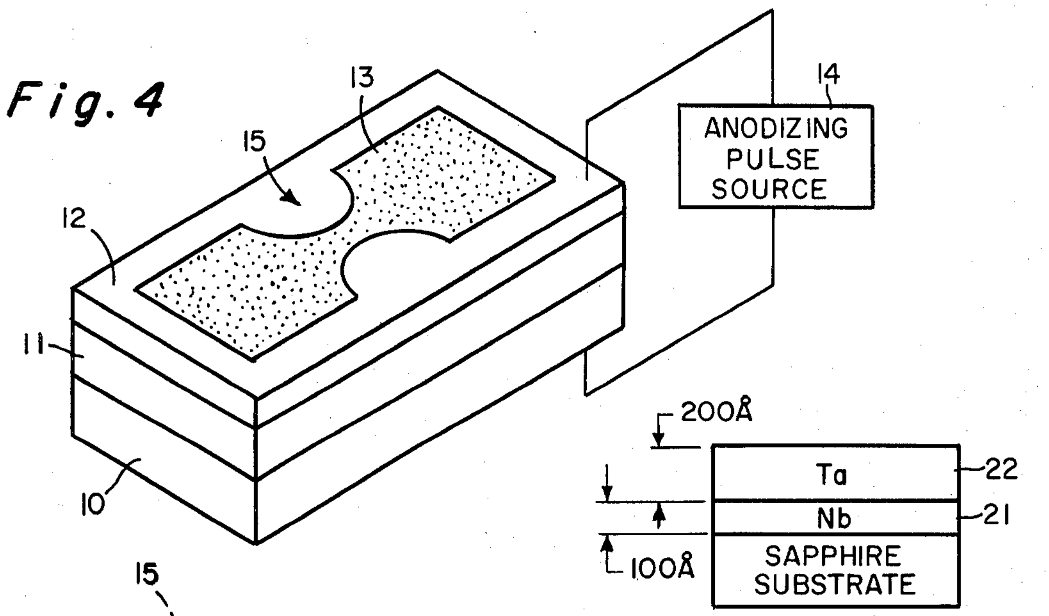
FIG. 8 is an end view of a second variant.

The next step prior to actually forming an inhomogeneous region, referred to hereafter as a phase-slip junction, is to shape the thin film structure by anodizing through the films 11 and 12 using a photoresist mask 13 as shown in FIG. 4. A commercially available photoresist, such as KPR by Kodak or AZ 1350 by Shipley may be used. In either case, the electrolyte used is preferably a weak acid, such as boric acid. The depth of anodization is controlled by the duration and magnitude of a voltage pulse applied from a source 14. In general, a high voltage for a short time is preferred to avoid "undercutting", i.e., anodization under the mask 13.

Figure 5:
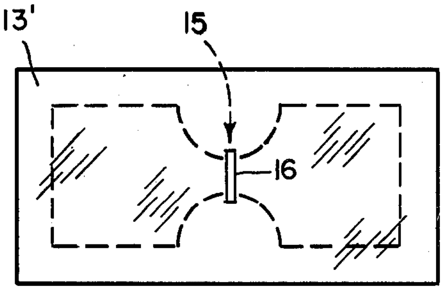
Figure 6:
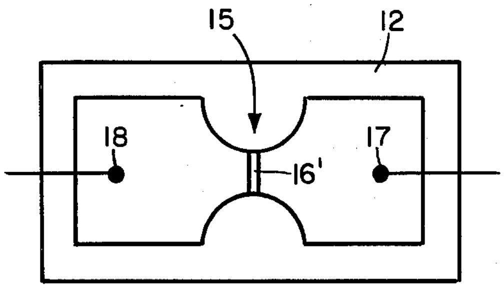

The shape of the mask 12 includes a necked down (narrow) region 15 of 10 to 100 microns. It is in this narrow region that the phase-slip junction is formed, again by anodizing through a photoresist mask 13′ shown in FIG. 5 as a narrow slit 16 across the narrowest point in the region 15. The slit is very narrow, about 1 micron, and the anodization through the slit is partially through the upper (Nb) film to a controlled depth. The result is an anodized line 16′ in the superconductive film 12 forming a phase-slip junction as shown in FIG. 6. Indium contacts 17, 18 are pressed onto the film on opposite sides of the junction to complete the circuit.

Since the first anodizing step (FIG. 4) is through both films, and the second anodizing step (FIG. 5) is only partly through the top film, the thin film structure which results is effectively as shown in FIG. 1. The two anodizing steps can be reversed, and are in practiced reversed as will be described more fully hereinafter.

The superconducting transition temperature for Ta alone is ≈4°K, and of Nb alone is ≈9°K. The net superconducting transition temperature in the inhomogeneous region of the layered structure is therefore between 6.5°K and 4°K, depending upon the depth of anodization. If anodization is completely through the Nb film 12, there is no further decrease in the transition temperature below ≈4.2°K. If prepared that way for use in a helium dewar, the depth of anodization would not be critical, i.e., the resulting transition temperature would not be critical.

Figure 7:
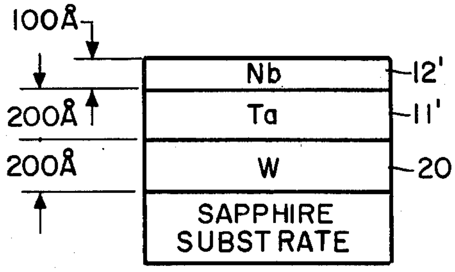
FIG. 7 is an end view of a first variant of structure produced by the technique described with reference to FIGS. 3 to 6.
Figure 11:
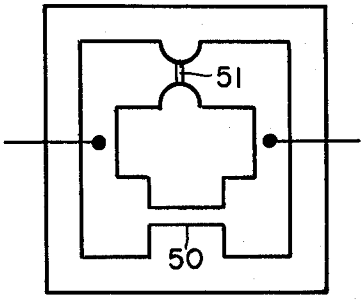
FIG. 11 is a topographical illustration of a superconductive microcircuit comprised of a resistor in parallel with a superconductive device formed as shown and described with reference to FIGS. 1 to 8.

A variant, shown in FIG. 7, employs the same techniques but starts with vapor deposition of a thin film 20 (100 A) of tungsten (W). The possibilities are now greater. The superconducting transition temperature of tungsten alone is less than 1°K, and tantalum on tungsten is ≈3°K. The transition temperature for all three layers is greater than 4.2°K. Consequently, anodizing a narrow line across a narrow region as before permits the transition temperature of the inhomogeneous region (due to proximity effects from the two adjoining sections) to be from >4.2°K to <1°K, depending upon the depth of anodization, with temperatures of 4.2°K and 3°K easily achieved by noncritical anodization through the first layer 12′ and the second layer 11′, respectively.

Another variant shown in FIG. 8 is prepared in the same way as the first example, but the niobium layer 21 is vapor deposited first. Anodizing through the upper layer 22 of tantalum provides a transition temperature from 9°K to 6.5°K, again depending upon the depth of anodization.

Still other possibilities have been successfully tested. A thin layer (100 A) of tantalum deposited on a thin layer (200 A) of tungsten was anodized through a narrow slit (0.7 microns) across a narrowed region (10 microns) to a depth half way through the lower layer of tungsten for use below the lambda point (2.17°K) of Helium. In this example the ratio of superconductor thickness to normal metal thickness is reduced to zero, but the transition temperature desired is achieved by control of the dimension $l$ due to the proximity effect referred to hereinbefore. The phase-slip effect was observed at temperatures from 2.2°K to 1.3°K, i.e., the resulting transition temperature of the inhomogeneous region was from 2.2°K to 1.3°K.

Figure 9:
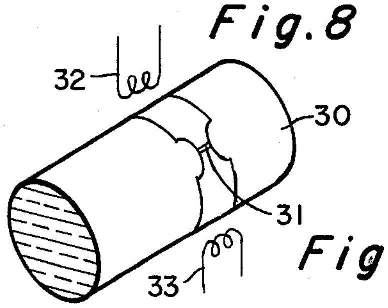
FIG. 9 shows an annular phase-slip junction circuit with inductive coupling to external circuits.
Figure 10:
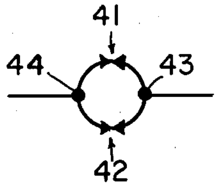
FIG. 10 is a schematic diagram of an annular circuit having two phase-slip junctions with direct connections to external circuits.

Other forms for the circuit may also be used, such as an annular form to which coupling is accomplished inductively as shown in FIG. 9. Here a sapphire rod is used to form the superconductive device 31 using the same techniques. To vapor deposit the film layers in cylindrical form, the rod is rotated slowly during the vapor deposition periods. Coils 32 and 33 are used to inductively couple to the circuit which may be used as a magnetometer sensor as described in a copending application filed concurrently by J. E. Mercereau and H. E. Hoenig titled Superconducting Quantum Magnetometer. Only one phase-slip junction is required there. A circuit having two phase-slip junctions 41 and 42 shown schematically in FIG. 10 may be made using the same techniques. Ohmic contacts 43 and 44 are made to the multilayered thin film sections between the phase-slip junctions, as shown.

Other metals, and compounds or alloys may be used which adhere strongly in vapor deposited films if they will not diffuse appreciably at room temperature, and are chemically stable under normal conditions of use, as noted hereinbefore.

In the procedure described with reference to FIGS. 1 through 4, the phase-slip junction 16′ is formed after the narrow region 14 has been formed. In practice, the junction 16′ may be formed first by anodizing a line of suitable dimensions, such as a line about 1 micron wide and 20 microns long, using a 10 msec pulse at about 20 volts. Then the narrow region is formed to the desired width by anodizing two dots centered on the anodized line spaced the desired distance apart. The dots may be about 70 microns in diameter. Since the dots are to be anodized through the niobium and tantalum films to the substrate, a 500 msec pulse at 50 volts is used. The limited time of 500 msec keeps the anodization process from "undercutting" into the anodized line. The rest of the niobium and tantalum films around the hour-glass shaped device shown in FIG. 4 is then anodized all the way through to the substrate using 50 volts for whatever time is needed, i.e., until anodizing current stops flowing. There will be significant undercutting around the edges of the mask used, but no undercutting in the narrow region 14 because there the layered films have already been anodized.

If the procedure described first with reference to FIGs. 1 through 4 is used, the step of anodizing the hour-glass shape may be accomplished in two steps by anodizing through with two properly spaced dots, and then anodizing through the rest using a rectangular mask having sides passing through the dots. The line across the narrowed region may then be anodized as before. This procedure has the advantage of having the narrowed region in the final structure substantially the same as the spaced dots in the mask used. However, anodizing the hour-glass shape in one step can be done, and a phase-slip junction formed successfully with the desired characteristics by taking into account the extent of undercutting in the narrow region by making the mask sufficiently wider in the narrow region.

An advantage of these methods of making phase-slip junctions is that other connected circuit elements can be formed in the layered films by the same anodizing process. For example, a resistor 50 in parallel with a phase-slip junction 51, as shown in FIG. 9, may be formed, a triple layered film on a substrate may be used. For example, zirconium, tantalum and niobium may be deposited in that order, each in a thin film (100 A) for a phase-slip junction to be made for use above 1°K. The junction 51 is formed as before, but in forming the hour-glass shape by anodizing through to the substrate, a thin parallel region in the layered films is left for the resistor 50. The length and width of that parallel region is determined by the value of resistance desired. For more length, the thin parallel region may be zigzagged. The resistor is then put in the thin parallel region of the layered films by anodizing down to the upper surface of the zirconium. The remaining unanodized zirconium in the thin parallel region then forms the resistor 50. In practice, it may be desirable to form the resistor and then anodize through the zirconium around it. In either case, the undercutting which takes place is taken into consideration. A series resistor may be provided in a similar manner and a capacitor may be included in parallel or in series with any circuit element by forming one plate in the zirconium layer using the same procedure as for the resistor. The second plate is then formed on top of the anodized films of niobium and tantalum by depositing a thin film of suitable metal over the area of the first plate. The first plate is connected to the circuit through unanodized zirconium, and the second plate through metal deposited at the time the second plate is deposited.

These phase-slip junctions, and circuits which include phase-slip junctions, can be fabricated by use of standard photoresist and anodization techniques as described. However, ion beam etching techniques of micromanipulation of the layered thin film structure may be used. The geometry remains the same, and other considerations may be taken into account in forming the structures. For example, with anodization techniques there is some undercutting which must be taken into consideration, even though such undercutting can be minimized. With ion beam etching techniques, undercutting is not a problem, but beyond the depth to which material is removed by ion bombardment, there may be some additional depth of material that is effectively removed by destruction of its conductivity as a consequence of atoms being disturbed during the bombardment process. However, as with undercutting in the anodization process, the extent to which it must be taken into account can be established empirically.

An advantage of the ion beam etching technique is, as suggested hereinbefore, that a larger group of known elements is avoidable for use as superconductors and normal metals in these thin film structures, namely a group consisting of Nb, Ta, W, Ti, Zr, Al, Hf, Re, Rh, Ir, Pd and Pt, as well as alloys and compounds of these elements, and alloys and compounds of these elements with other elements. In addition, some ferromagnetic alloys, such as alloys of iron, cobalt and nickel, can be used as a normal metal, as noted hereinbefore. For the anodizing technique, only the first seven elements are suitable because only those form hard oxides that are stable, and Hf is suitably only as a normal metal because a transition temperature for it has not been recognized, although as in the case of Pt, it is believed to exist if temperature is reduced to a low enough point. Al is included as suitable for both techniques, but its use may be limited because it will not bond well, and may therefore increase rejection and failure rates in the devices fabricated.

In hard superconductor structures which have been fabricated in accordance with the present invention, only slight alloying between the films occurred during film fabrication, which could be neglected, and some variation of transition temperature $T_c$ occurred in these structures via the proximity effect as previously described. However, very thin, hard superconducting films, themselves, have transition temperatures which vary somewhat with thickness, probably due to the variation of the structure of the film as it grows. For these thin films, no superimposed normal metal film is necessary and the thickness of the superconductor alone can be varied to generate all the necessary local modification of superconductivity. Generally, however, this thickness variation of the transition temperature occurs only over a very small thickness range and the enhancement of the variation of $T_c$ via the proximity effect with superimposed films is technically desirable. Hence, when two superconducting films with different transition temperatures are superimposed both the proximity effect and the inherent thickness variation of $T_c$ are available as possible modes of local weakening of superconductivity. The true proximity effect junction has been most extensively studied for Nb on Ta thin film structures, while junctions based on the thickness dependence of $T_c$ have primarily been studied using Ta films.

The range of parameters over which these Nb/Ta structures have been observed to show Josephson-like effects are length $0.3\mu - 5\mu$, widths $0.5\mu - 300\mu$, inhomogeneity thicknesses 50A – 250A, $T_c$ from 4.2°K down to below 1.3°K and normal resistances $10^{-2}\Omega - 50\Omega$. These film properties, lengths, widths, thicknesses, and resistances are typical ranges for all the hard superconductors. Because of the particular properties of these materials — the good film to substrate bond, the hard, protective, and easily controllable oxide, and the fine grain nature of the films — it is possible to reproducibly work with well defined dimensions down to at least $0.3\mu$. The anodization process which is extremely well controlled is known to obtain this resolution. These structures are much more stable than the soft superconductors and although lifetime tests have not been completed, circuits have been operated which show no change in characteristics over a period of a year.

As already mentioned, the Josephson operation of the inhomogeneous film structures is essentially the same regardless of the materials used. Within this technique the main requirement is a properly constructed structure consisting of layered superconducting and normal films, or layered superconducting films with different transition temperatures. Since the proximity effect determines the properties of the inhomogeneous region, both because of the layer structure and the proximity effect of the adjoining films, it is necessary that the layers be formed with no barrier of oxide or other contamination between the films. If a barrier does exist the necessary proximity effects are seriously affected and the fabrication of the inhomogeneity is interfered with or precluded. It is also necessary that the films be extremely homogeneous over the entire film. Local inhomogeneities inadvertently produced in the "as fabricated" films also produce Josephson-like effects of the same type as observed when the inhomogeneities are controllably introduced. Consequently, to control the inhomogeneities the film properties must be sufficiently uniform so that any $0.3\mu$ region of the film corresponds to any other. Once these conditions on uniformity and absence of any barrier between films are met, all the material combinations function essentially the same way except for only small variations in the necessary film thicknesses and inhomogeneity lengths which are dependent on particular material combinations. Well controlled inhomogeneous film structures showing Josephson-like effects have been produced with a large range of electrical parameters with many materials.

Figures 12, 13:
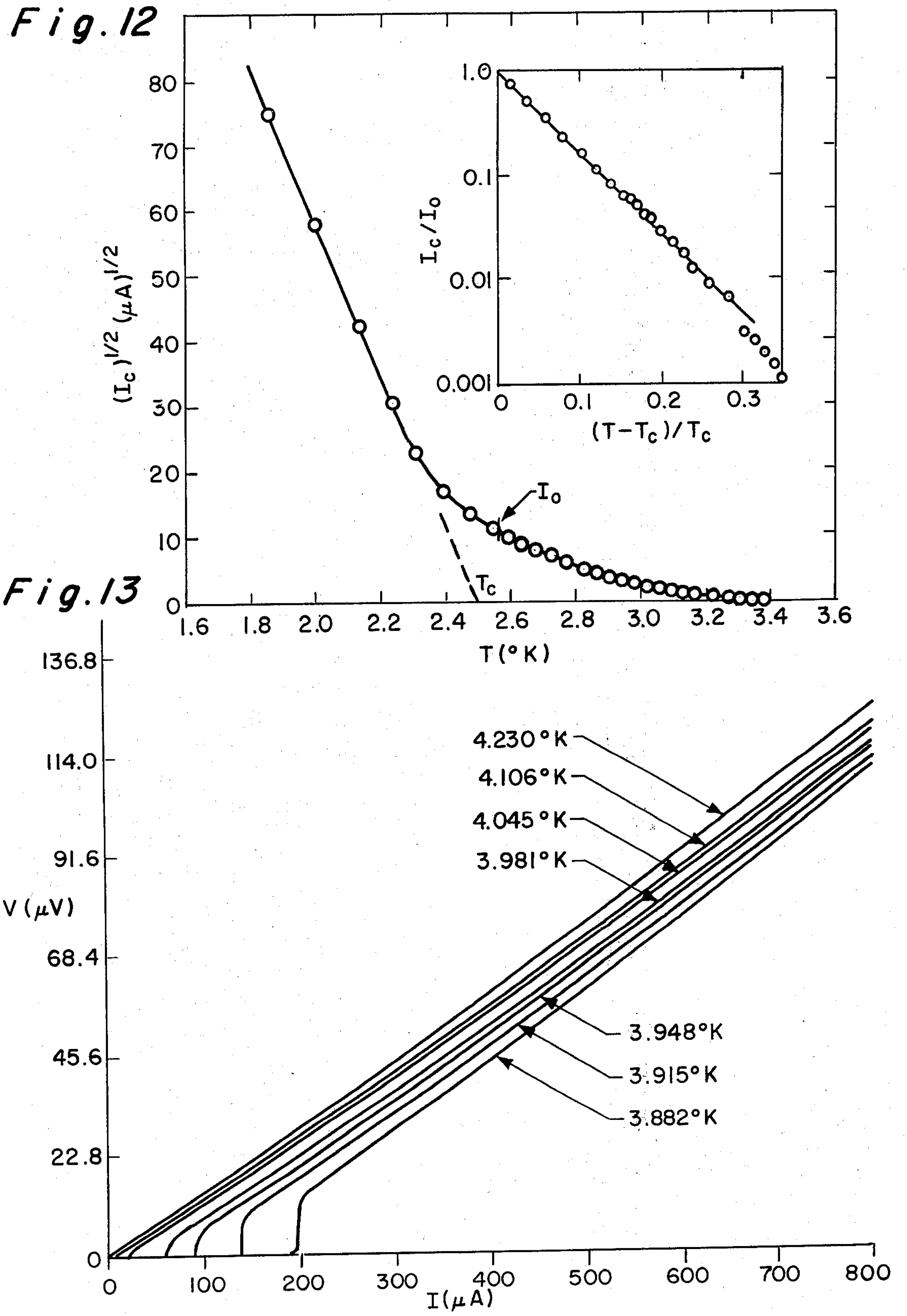
FIGS. 12 through 16 show some general electrical characteristics of structures prepared in accordance with the present invention.

Some of the general electrical characteristics of these structures will now be described with reference to FIGS. 12 through 16. FIG. 12 shows the critical current, $I_c$ (maximum current at zero voltage) as a function of temperature for a short Au/Sn phase-slip junction, hereinafter referred to as a "bridge," of distinguish the phase-slip junction from a Josephson tunnel junction. This Au/Sn bridge is $1.1\mu$ long, with 250A Au beneath 1000A Sn and a $T_c$ of 2.5°K. As has been noted the transition temperature of the bridge for long bridges is $T_c$ (the transition temperature for the sandwich material forming the bridge) but for short bridges it is greater than $T_c$ because of the proximity effect of the main part of the adjoining superconductors on both sides of the bridge. For long bridges the temperature dependence of $I_c$ is proportional to $(T_c-T)^{3/2}$ as expected from a mean-field theory. For short bridges this dependence exists at low temperatures but near and above $T_c$ there is an extra critical current due to the proximity of the adjoining superconducting films. This extra critical current persists above $T_c$ and is exponential in $(T-T_c)$. FIG. 12 shows the temperature dependence of the critical current near $T_c$ where the dependence becomes exponential in $(T-T_c)$. The $T_c$ can be determined by extrapolation of the intermediate region (which agrees with $T_c$ measured in longer bridges) and the insert of FIG. 12 shows the exponential nature of $I_c$ above $T_c$.

FIG. 13 gives current-voltage (I-V) characteristics for a $0.9\mu \times 15\mu$ Nb/Ta bridge with current source biasing for several temperatures below the transition temperature of the bridge. There are two common features of all such I-V characteristics. First, when the critical current $I_c$ is exceeded there is an initial voltage increase which becomes steeper as the temperature decreases. At low enough temperatures (lower than shown on FIG. 13) this eventually leads to switching and hysteresis whose cause has not yet been investigated. Second, at high currents the voltage across the bridge does not revert to the normal voltage curve ($I_c=0$) as might be expected from a model involving a resistively shorted Josephson tunnel junction. This gives rise to a parallel series of I-V curves as T decreases. Hence, the bridge at finite voltage always has an apparent "excess current" over its current in its normal state even at very large voltages. This excess current is associated with dissipation in the bridge in its superconducting voltage sustaining state and will be discussed later.

Figure 14:
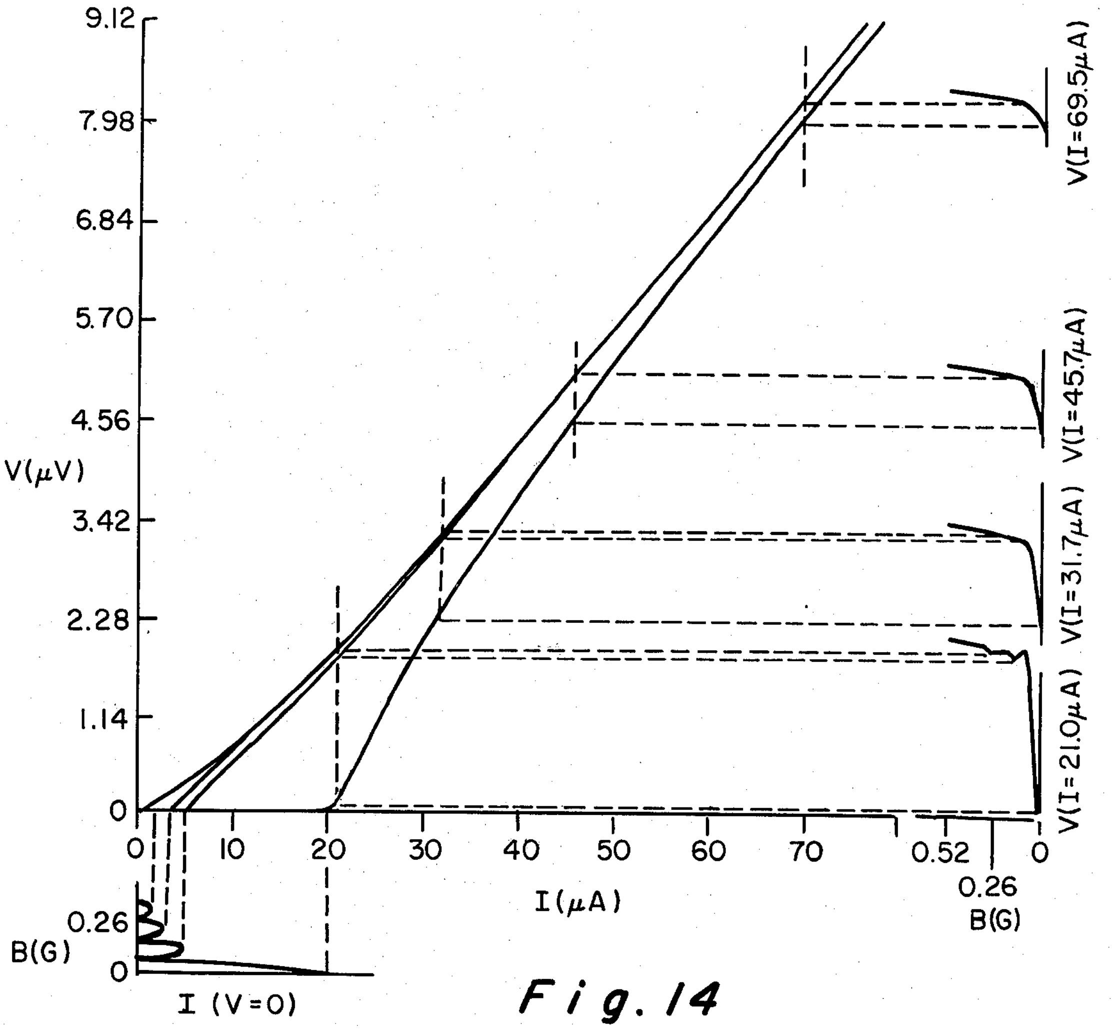
Figure 15A:
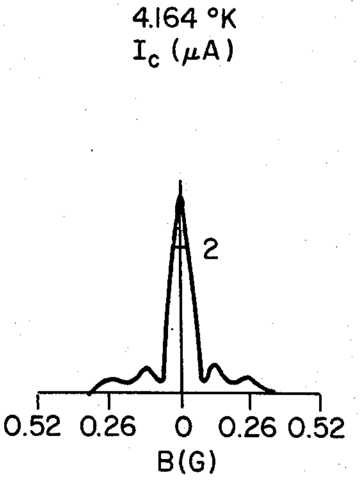
Figure 15B:
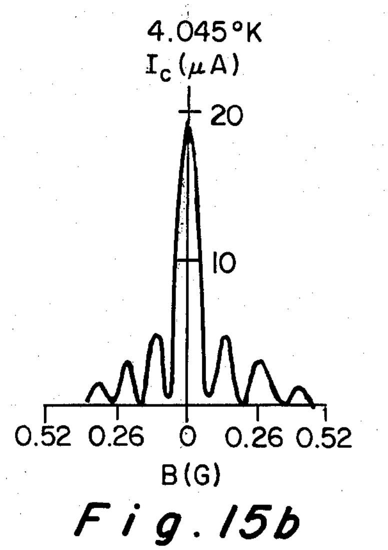
Figure 15C:
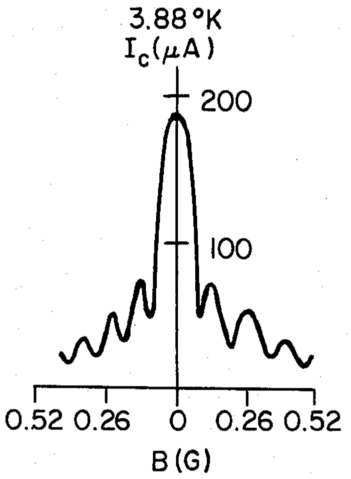

The Josephson-like response of the bridge is mainly characterized by sensitivity to magnetic fields and to rf radiation. FIG. 14 gives I-V characteristics for the $0.9\mu \times 15\mu$ Nb/Ta bridge as a function of magnetic field B applied normal to the bridge area. Demagnetizing effects from the film distort the applied field but if these are taken into account it can be shown that the critical current $I_c$ is modulated with field with a periodicity of the flux quantum $\phi_o$. As is seen from FIG. 14, the modulation of voltage with magnetic field at constant I decreases as the voltage increases. Hence, the major magnetic field modulation effects of the I-V characteristics are confined to the low voltage region. FIGS. 15*a*, *b* and *c* give the modulation of $I_c$ with B as a function of temperature. At low $I_c$ the magnetic field drives the $I_c$ to zero periodically, but at high enough $I_c$ (or low enough T), the magnetic field can no longer completely suppress $I_c$, although the modulation period remains constant.

For a sufficiently large applied magnetic field flux trapping occurs in these bridges accompanied by a shift of the $I_c$ vs. B curve to a new effective zero field centered around the trapped flux. Although this effect has not been fully investigated, it has been noted that structures made with permalloy as the normal metal appear much more sensitive to flux trapping. Consequently, the switching and memory capabilities of these structures (and in particular, ferromagnetic superconducting structures) present interesting possibilities.

Figure 16A:
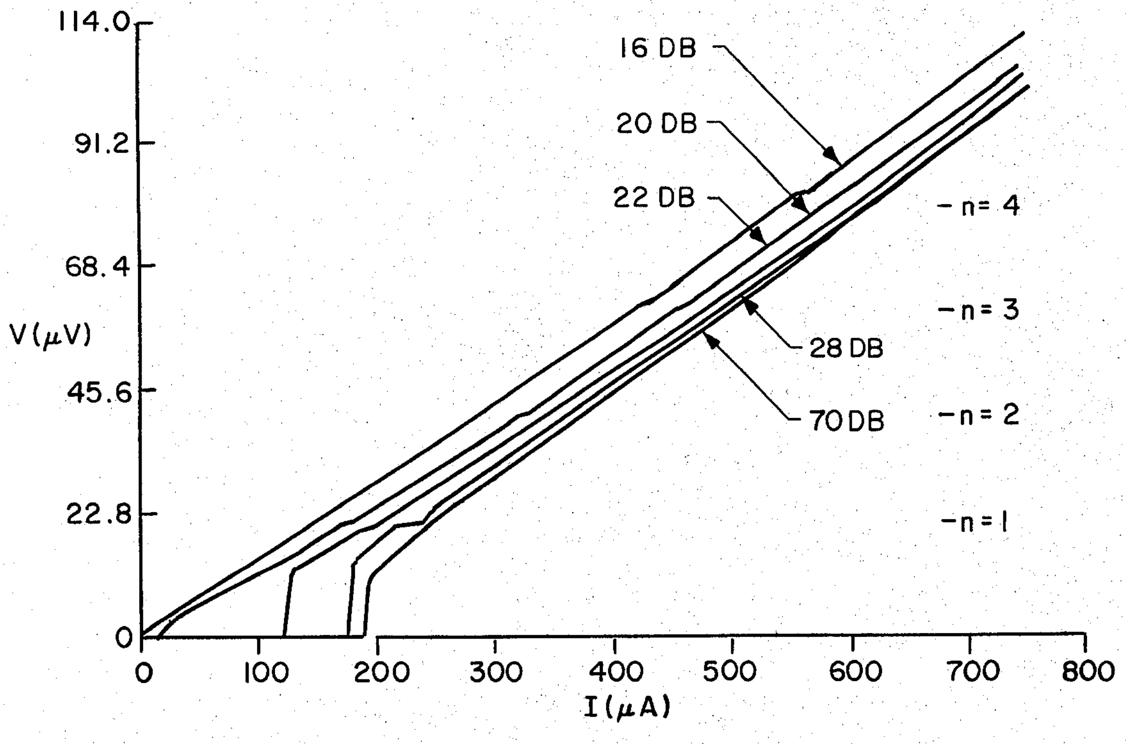
Figure 16B:
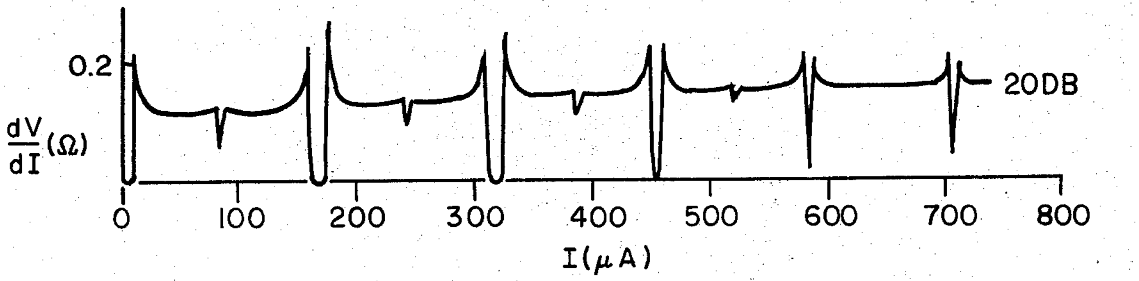

FIG. 16*a* shows the effect of 10 GHz radiation on the I-V characteristics of the $0.9\mu \times 15\mu$ Nb/Ta bridge (at zero modulation field B). As the rf power (DB) is increased, the critical current decreases, current "steps" appear at voltages $$V = \frac{n\hbar}{2e}\omega,$$

where $n$ are integers, and a number of subharmonic steps also appear. The size of the current steps is a function of power and the first step shows modulation with power. As the power is increased higher order steps become more prominent as expected until at too high a power the entire effect is suppressed. A $\delta V/\delta I$ vs. I curve is plotted in FIG. 16*b* to enhance the features of the I-V curve and show more fully the size of the current steps and the subharmonics.

Simultaneous application of a B field normal to the bridge and rf radiation shows that depression of $I_c$ by B also uniformly depresses the rf current steps. When the $I_c$ is totally depressed by a normal magnetic field, there is no rf response. Hence, the size of the rf response is dependent on $I_c$ size both through its temperature dependence and through its magnetic field dependence $I_c(B)$.

What is claimed is:

1. A superconducting thin film structure exhibiting quantum phenomena comprised of superimposed thin films of selected metals at least one of which is superconducting below a predetermined temperature, said thin film structure being separated into two parts by a thin line region of dimension $l$ in the direction of current flow from one part to the other, said region having a ratio of thickness of at least one superconductive film to the thickness of the remaining thin films in said thin line region less than a corresponding ratio of thickness in the adjoining parts of said structure.

2. A superconducting thin film structure as defined in claim 1 wherein all of said metals are selected to be metals which will not diffuse appreciably at normal room temperature, and which are sufficiently inert to be chemically stable under normal use.

3. A superconducting thin film structure as defined in claim 2 wherein said dimension $l$ is less than 2 microns.

4. A superconducting thin film structure as defined in claim 1 wherein said dimension $l$ of said thin line region is sufficiently less than about 1 micron for the transition temperature of said thin line region to be higher than its characteristic transition temperature established by said ratio of thicknesses in said thin line region due to proximity effects from said two adjoining parts.

5. A superconducting thin film structure as defined in claim 1 wherein said thin film structure has a narrowed section of a dimension greater than $l$ measured in the same direction as said thin line region, said narrowed section extending on both ends of said thin line region.

6. A superconducting thin film structure exhibiting quantum phenomena comprised of a plurality of thin films deposited one on top of the other on a nonconductive substrate, each film being of a different metal and at least one film being a superconductor below a predetermined transition temperature, said multilayered thin film structure having a predetermined area of superconductivity including a thin line separating said area into two parts, said thin line having a dimension $l$ in the direction of current flow from one of said parts to the other and having a transition temperature different from the transition temperature of said parts due to the ratio of thickness of one or more thin films of superconductive metal of higher transition temperature to thickness of the remaining thin films in said thin line region different from a ratio of thickness of said one or more thin films of superconductive metal to the thickness of the remaining thin films in said predetermined area of superconductivity outside of said thin line region.

7. A structure as defined in claim 6 wherein said predetermined superconductive area has a narrowed section and said thin line region is across said narrowed section.

8. A structure as defined in claim 7 wherein said dimension *l* of said thin line region is sufficiently small for the transition temperature of said thin line region to be higher than its characteristic transition temperature established by said ratio due to proximity effects from said adjoining two parts of said thin film structure.

9. A structure as defined in claim 8 wherein said dimension *l* is less than about 1 micron.

10. A structure as defined in claim 9 wherein each of said thin films is about 100 to 200 Angstroms thick.

11. A structure as defined in claim 8 including an ohmic contact to each of said parts of said multilayered thin film structure on opposite sides of said thin line region.

12. A structure as defined in claim 7 wherein said substrate is in the form of a cylinder, said thin films are deposited around said cylinder, and said predetermined area forms a band around said cylinder.

13. A structure as defined in claim 12 including at least one coil inductively coupled to said band of multilayered thin films.

14. A structure as defined in claim 13 including a second narrowed section and a thin line across said second narrowed section made more weakly superconducting in the same manner as a thin line region in the first narrowed section, and ohmic contacts made to multilayered thin film parts between said thin line regions.

15. A method of making structures exhibiting quantum phenomena comprised of the steps of: depositing a plurality of thin films, one on top of the other, on a nonconductive substrate, each film being of a different metal, one or more films being superconductive below a predetermined transition temperature or temperatures; defining a desired area of superconductivity in said films by manipulation to effectively remove all layers around said area through to said substrate, and manipulating said thin films to effectively remove metal from one or more of said thin films of higher transition temperatures to decrease the ratio of thickness of said one or more thin films of superconductive metal of higher transition temperature to the thickness of the remaining thin films in a thin line region across said desired area, thereby altering the superconductivity transition temperature of said area of layered films to a temperature different from the transition temperature of adjoining thin film structure.

16. A method as defined by claim 15 wherein said manipulation is by selective anodization using a photoresist mask.

17. A method as defined by claim 15 wherein said manipulation is by selective ion beam etching using a photoresist mask.

18. A method as defined by claim 15 wherein said thin line region is defined by anodizing through at least part of one film before said desired area is defined by anodizing through all thin films to said substrate, and the metal for each film is selected to form a stable oxide during anodization.

19. A method as defined by claim 18 wherein said area has a narrowed section containing said region and said narrowed section is defined before said area is defined by anodizing two small spaced apart areas using a timed pulse of predetermined voltage before anodizing the rest of said films around said desired area using a predetermined voltage for a sufficient time to complete anodization.

20. A method as defined in claim 15 wherein metals for all of said films are selected to be metals which will not diffuse appreciably at normal room temperature.

21. A method as defined in claim 20 wherein metals for all of said films are selected to be metals which are sufficiently inert to be chemically stable under normal use of said structures.

* * * * *

UNITED STATES PATENT OFFICE

CERTIFICATE OF CORRECTION

Patent No. 3,911,333 Dated October 7, 1975

Inventor(s) HARRIS A. NOTARYS and JAMES E. MERCEREAU

It is certified that error appears in the above-identified patent and that said Letters Patent are hereby corrected as shown below:

COLUMN 1: line 20, "vice" should be --vices--
line 56, "timed" should be --time- COLUMN 2: line 50, "$I_sV$" should be --$\bar{I}_sV$--

COLUMN 3: line 34, "$\approx$" should be -- $\sim$ --
line 37, "$\approx$" should be -- $\sim$ --

COLUMN 4: line 16, "or" should be --of--

COLUMN 5: line 36, "or" should be --of--

COLUMN 6: line 14, delete "is"
line 15, delete the whole line

COLUMN 8: line 41, "12" should be --13--
lines 60, 61 and 66, "$\approx$" should be -- $\sim$ --

COLUMN 9: line 8, "$\approx$" should be -- $\sim$ --

COLUMN 11: line 27, "suitably" should be --suitable--

COLUMN 12: line 51, "of" should be --to--

COLUMN 14: line 3, "$\delta V/\delta I$" should be --$\partial V/\partial I$--
lines 22, 34, 37, 46 and 58, "1" should be -- $\ell$ --

COLUMN 15: lines 8 and 14, "1" should be -- $\ell$ --

Signed and Sealed this

Twenty-fourth Day of August 1976

[SEAL]

*Attest:*

RUTH C. MASON
*Attesting Officer*

C. MARSHALL DANN
*Commissioner of Patents and Trademarks*